(12) United States Patent
Wu et al.

(10) Patent No.: US 11,804,569 B2
(45) Date of Patent: Oct. 31, 2023

(54) MICRO SEMICONDUCTOR STRUCTURE HAVING DISSOCIATIVE LAYER

(71) Applicant: PlayNitride Display Co., Ltd., Miaoli County (TW)

(72) Inventors: Bo-Wei Wu, Miaoli County (TW); Shiang-Ning Yang, Miaoli County (TW); Yu-Yun Lo, Miaoli County (TW); Yi-Chun Shih, Miaoli County (TW)

(73) Assignee: PlayNitride Display Co., Ltd., Miaoli County (TW)

( * ) Notice: Subject to any disclaimer, the term of this patent is extended or adjusted under 35 U.S.C. 154(b) by 225 days.

(21) Appl. No.: 17/109,161

(22) Filed: Dec. 2, 2020

(65) Prior Publication Data

US 2022/0069180 A1 Mar. 3, 2022

(30) Foreign Application Priority Data

Aug. 31, 2020 (TW) .................................. 109129787

(51) Int. Cl.
*H01L 33/00* (2010.01)
*H01L 33/44* (2010.01)

(52) U.S. Cl.
CPC .......... *H01L 33/0093* (2020.05); *H01L 33/44* (2013.01)

(58) Field of Classification Search
CPC ......................... H01L 33/56; H01L 2933/005
See application file for complete search history.

(56) References Cited

U.S. PATENT DOCUMENTS

| 9,379,092 | B2 | 6/2016 | Hu et al. | |
|---|---|---|---|---|
| 2017/0162552 | A1 | 6/2017 | Thompson | |
| 2018/0040765 | A1 | 2/2018 | Henley et al. | |
| 2018/0204973 | A1 | 7/2018 | Jeung et al. | |
| 2018/0374828 | A1* | 12/2018 | Liao | H01L 25/167 |
| 2019/0013297 | A1* | 1/2019 | Lai | H01L 33/382 |
| 2020/0328332 | A1* | 10/2020 | Song | H01L 33/62 |
| 2020/0403028 | A1* | 12/2020 | Kusunoki | H01L 33/505 |

FOREIGN PATENT DOCUMENTS

| TW | 201914049 A | 4/2019 |
|---|---|---|
| TW | 202023047 A | 6/2020 |

* cited by examiner

*Primary Examiner* — Jay C Chang
*Assistant Examiner* — Mikka Liu
(74) *Attorney, Agent, or Firm* — CKC & Partners Co., LLC

(57) ABSTRACT

A micro semiconductor structure includes a substrate, a dissociative layer, a protective layer and a micro semiconductor. The dissociative layer is located on one side of the substrate. The protective layer is located on at least one side of the substrate. The micro semiconductor is located on the side of the substrate. The transmittance of the protective layer for a light source with wavelength smaller than 360 nm is less than 20%.

12 Claims, 14 Drawing Sheets

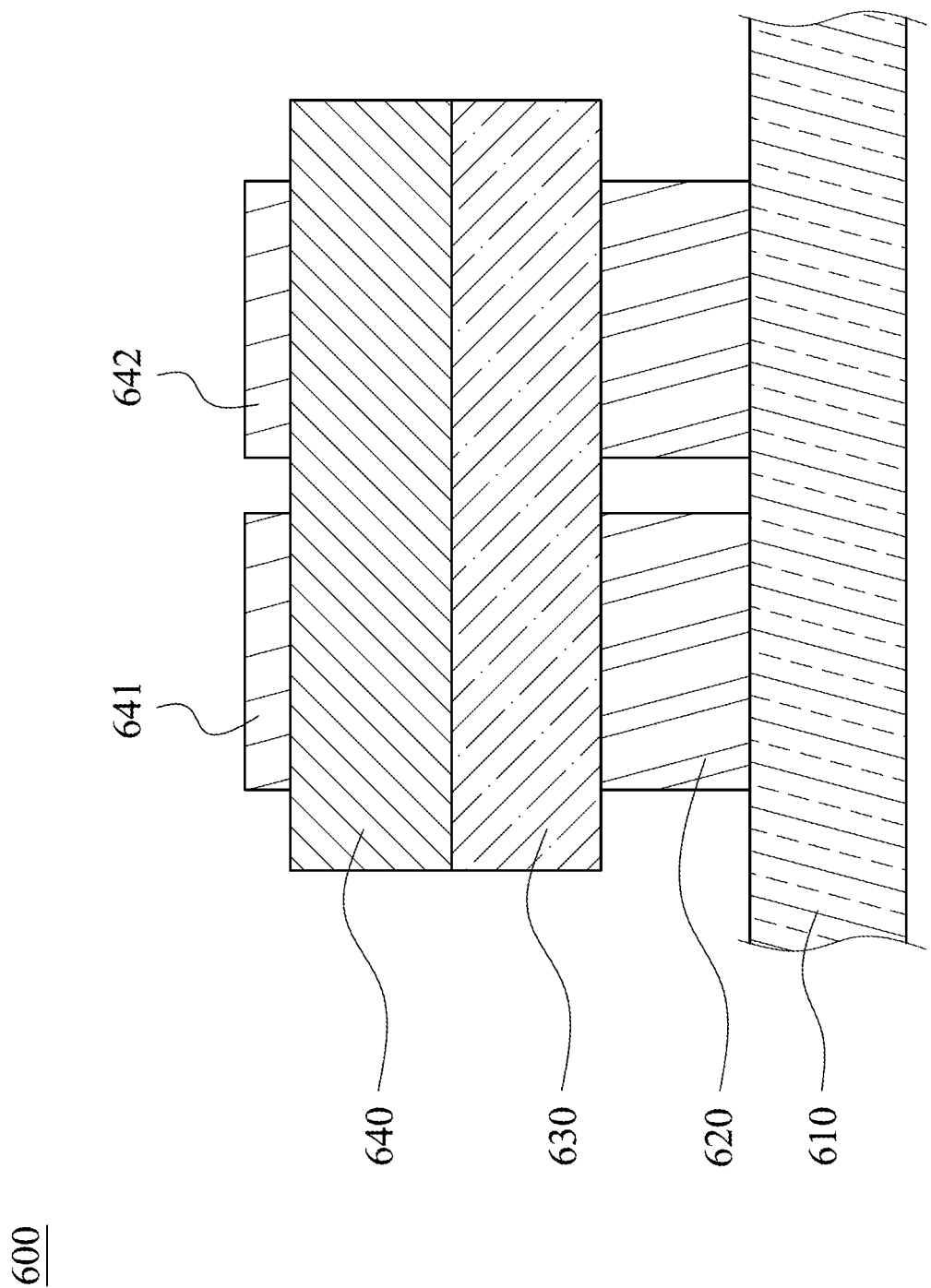

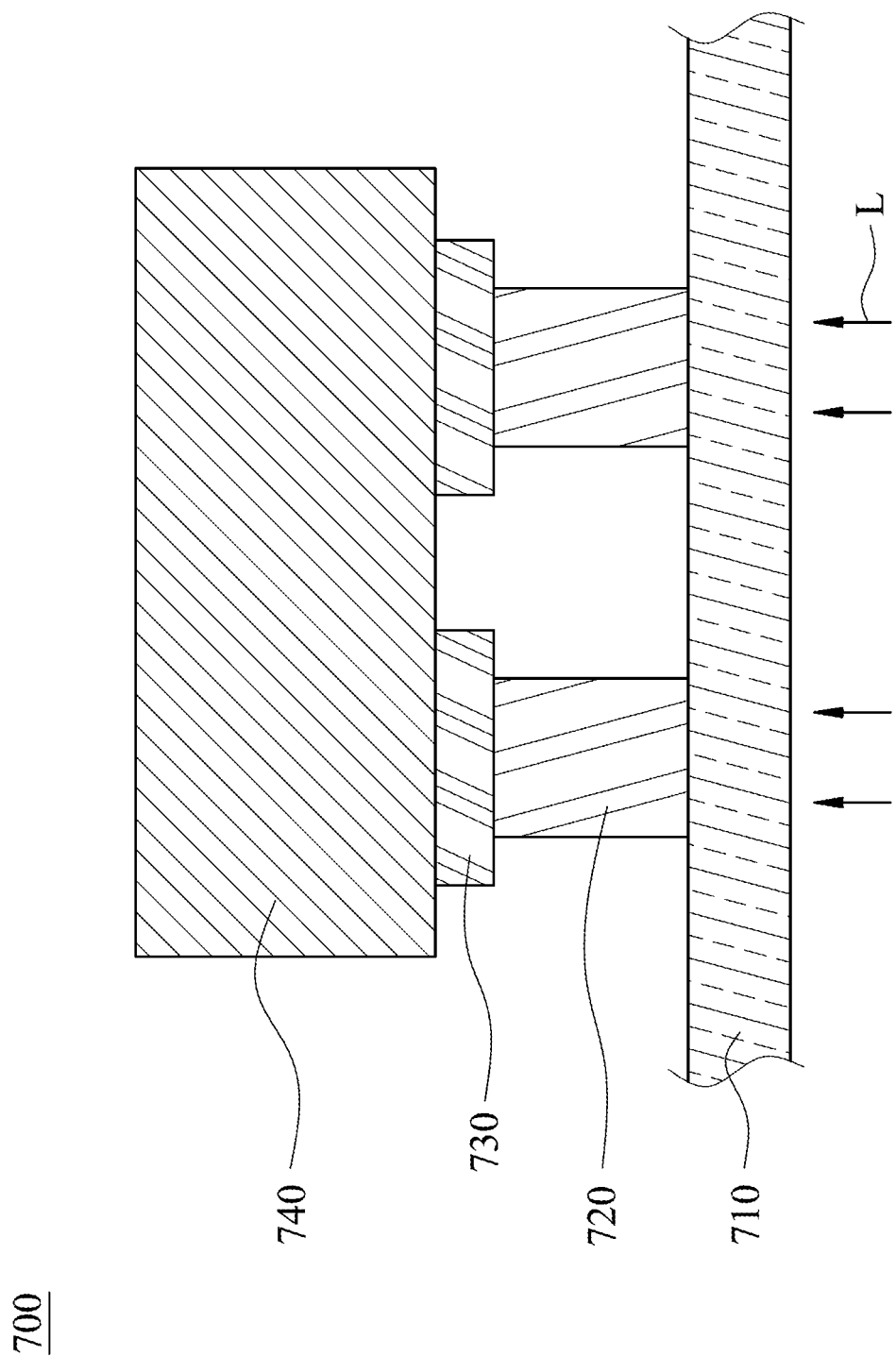

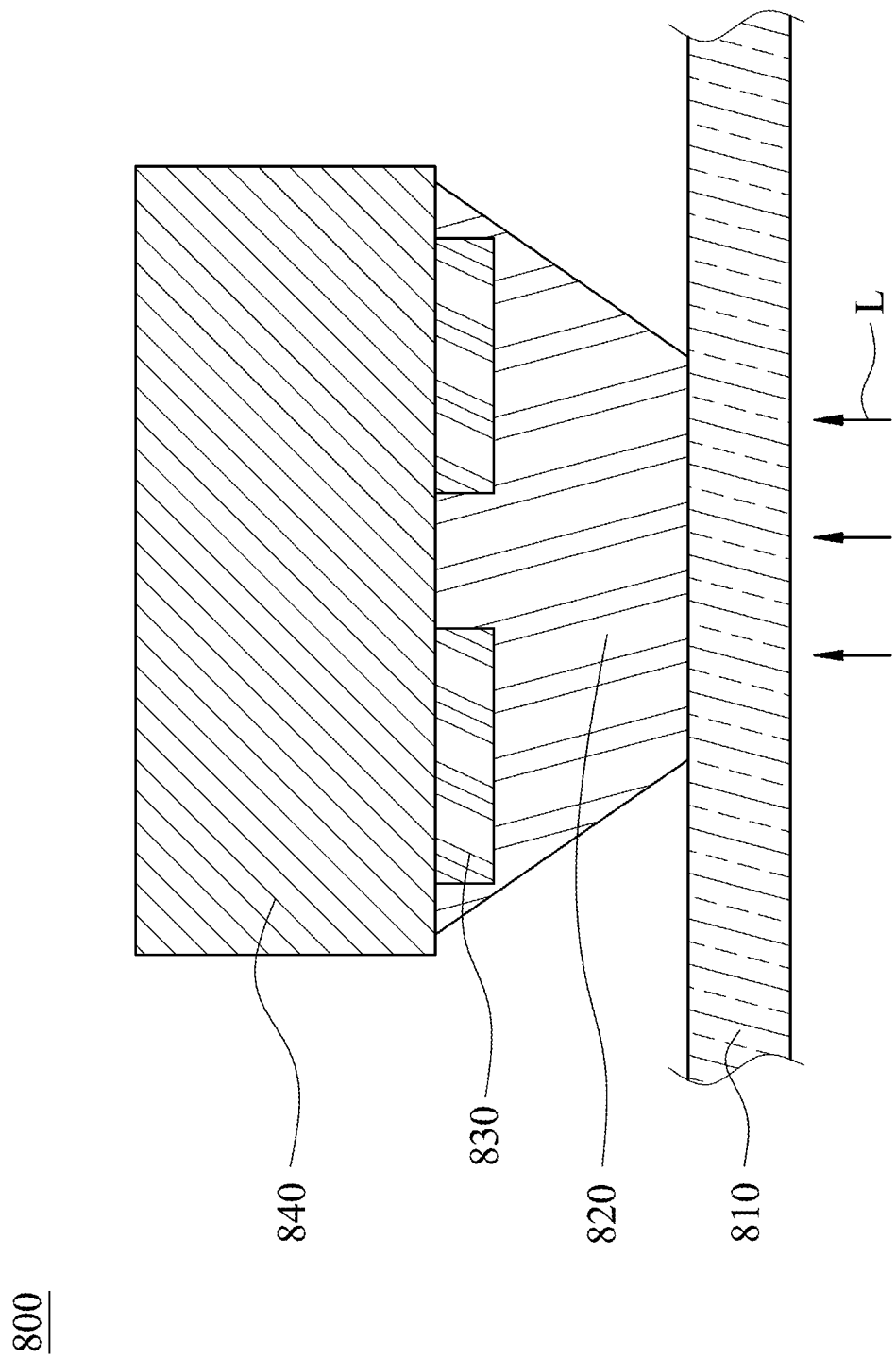

S100

MICRO SEMICONDUCTOR STRUCTURE HAVING DISSOCIATIVE LAYER

RELATED APPLICATIONS

This application claims priority to Taiwan Application Serial Number 109129787, filed Aug. 31, 2020, which is herein incorporated by reference.

BACKGROUND

Technical Field

The present disclosure relates to a micro semiconductor structure and a manufacturing method thereof. More particularly, the present disclosure relates to a micro semiconductor structure and a manufacturing method thereof which is applied to a laser lift-off (LLO) process.

Description of Related Art

Various micro semiconductors, such as organic light-emitting diodes (OLED), micro light-emitting diodes (Micro LED), are widely applied to various electronic devices in recent years. Micro semiconductors usually need to be manufactured on different substrates during manufacturing, and a LLO process is usually used for detaching the micro semiconductors from the substrates such as the growth substrate, so as to transfer and manufacture the micro semiconductor among different substrates. However, when the micro semiconductors are minified to micron size, the micro semiconductors usually become abnormal or are damaged since the irradiation of the laser light source during the LLO process. Therefore, a development of a micro semiconductor structure and a manufacturing method thereof which are suitable for LLO process is desired.

SUMMARY

According to one aspect of the present disclosure, a micro semiconductor structure includes a substrate, a dissociative layer, a protective layer, and a micro semiconductor. The dissociative layer is located on one side of the substrate, the protective layer is located on at least one side of the substrate, and the micro semiconductor is located on the side of the substrate. A transmittance of the protective layer for a light source with wavelength smaller than 360 nm is less than 20%.

According to another aspect of the present disclosure, a manufacturing method of a micro semiconductor structure includes steps as follow. A substrate providing step, a dissociative layer disposing step, a protective layer disposing step and a micro semiconductor disposing step are performed. In the substrate providing step, a substrate is provided. In the dissociative layer disposing step, a dissociative layer is disposed on one side of the substrate. In the protective layer disposing step, a protective layer is disposed on at least one side of the substrate. In the micro semiconductor disposing step, a micro semiconductor is disposed on the side of the substrate. A transmittance of the protective layer for a light source with wavelength smaller than 360 nm is less than 20%.

BRIEF DESCRIPTION OF THE DRAWINGS

The present disclosure can be more fully understood by reading the following detailed description of the embodiment, with reference made to the accompanying drawings as follows:

FIG. 6B is a structure schematic view of a micro semiconductor structure according to another example of the 6th embodiment of the present disclosure.

FIG. 7 is a structure schematic view of a micro semiconductor structure according to the 7th embodiment of the present disclosure.

FIG. 8 is a structure schematic view of a micro semiconductor structure according to the 8th embodiment of the present disclosure.

DETAILED DESCRIPTION

Figure 1A:
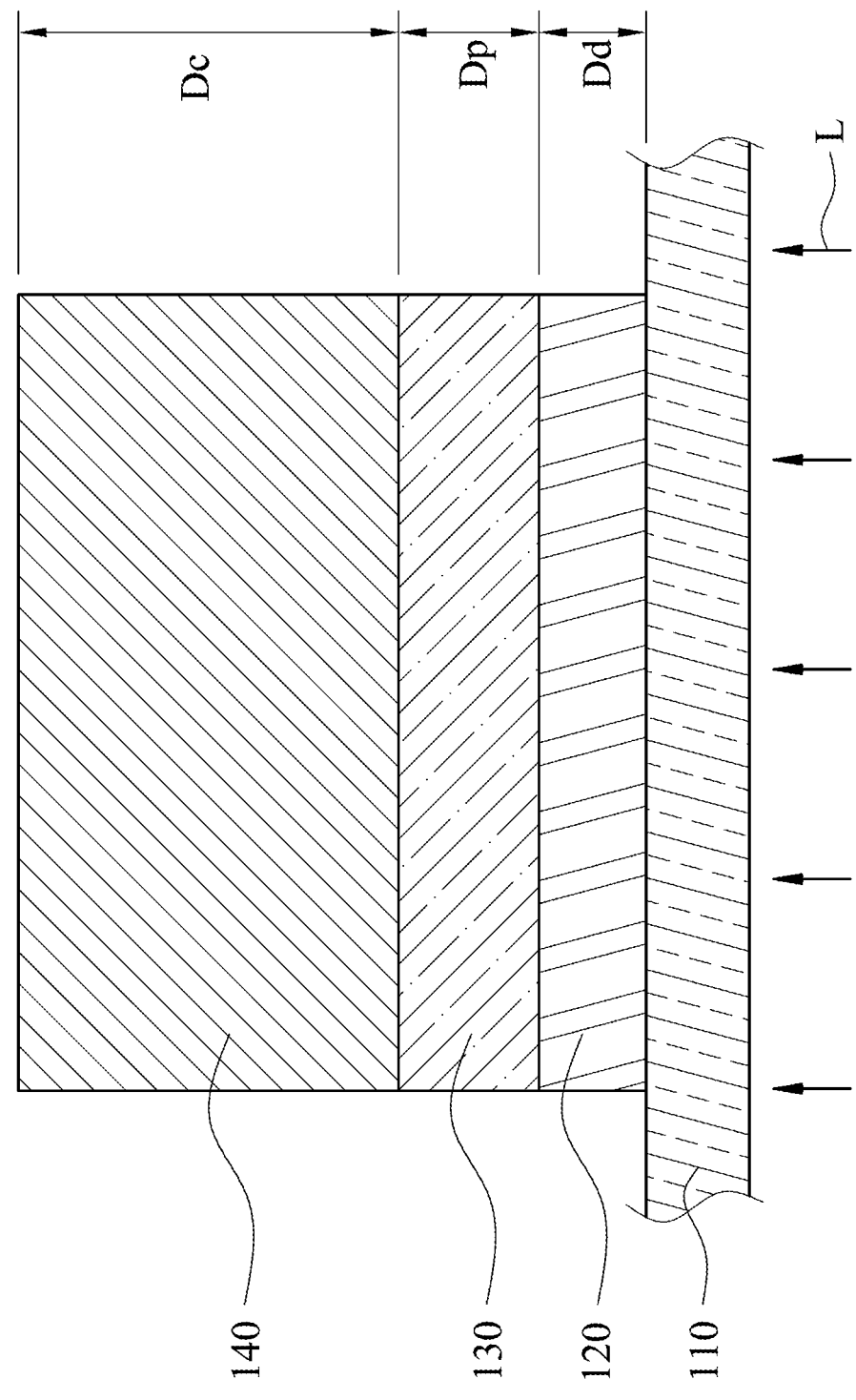
FIG. 1A is a structure schematic view of a micro semiconductor structure according to one example of the 1st embodiment of the present disclosure.

FIG. 1A is a schematic view of a micro semiconductor structure 100 according to one example of the 1st embodiment of the present disclosure. As shown in FIG. 1A, the micro semiconductor structure 100 includes a substrate 110, a dissociative layer 120, a protective layer 130, and a micro semiconductor 140, wherein the dissociative layer 120, the protective layer 130, and the micro semiconductor 140 are disposed on the substrate 110 in order.

In detail, according to the 1st embodiment, the dissociative layer 120 is located on one side of the substrate 110 and is disposed on the substrate 110. The dissociative layer 120 is made of a photo-dissociative material, which can be dissociated by the irradiation of a light source L (which wavelength is between 240 nm to 360 nm) during the manufacturing of the micro semiconductor structure 100, so that the structures thereon, such as the protective layer 130 and the micro semiconductor 140 can be detached from the substrate 110 and transfer to another target substrate (e.g., a substrate with circuit) so as to be favorable for the following processes. The dissociative layer 120 can be made of an organic material including an organic polymer, such as polyimide, benzocyclobutene, phenol formaldehyde resin, epoxy resin, polyisoprene rubber or combinations thereof, but the present disclosure is not limited thereto.

Further, the protective layer 130 is disposed on the dissociative layer 120, and the protective layer 130 and the dissociative layer 120 are located on the same side of the substrate 110, but the present disclosure is not limited thereto. A transmittance of the protective layer 130 for the light source L with wavelength smaller than 360 nm is less than 20% (which can be between 0% to 20%), so that it is favorable for preventing the micro semiconductor 140 becoming abnormal or to be damaged from the light source L during the photo-dissociative process by the protective layer 130. The light source L mentioned in this paragraph can be a laser light source.

Furthermore, a Young's modulus of the protective layer 130 can be greater than a Young's modulus of the dissociative layer 120. Therefore, the protective layer 130 can be used as a protective buffer layer so as to reduce the impact and effect of the light source L to the micro semiconductor 140 during transfer.

In detail, the protective layer 130 can be made of an inorganic material or a metal material such as nitrides, oxides, metals or alloys. Furthermore, the protective layer 130 can be made of silica, silicon nitride, silicon oxynitride or combinations thereof. The protective layer 130 can also be made of aluminum, silver, gold, alloy thereof or oxide thereof, but is not limited thereto. In particular, the protective layer 130 can be removed as required, which can be removed by an etching process.

Figure 1B:
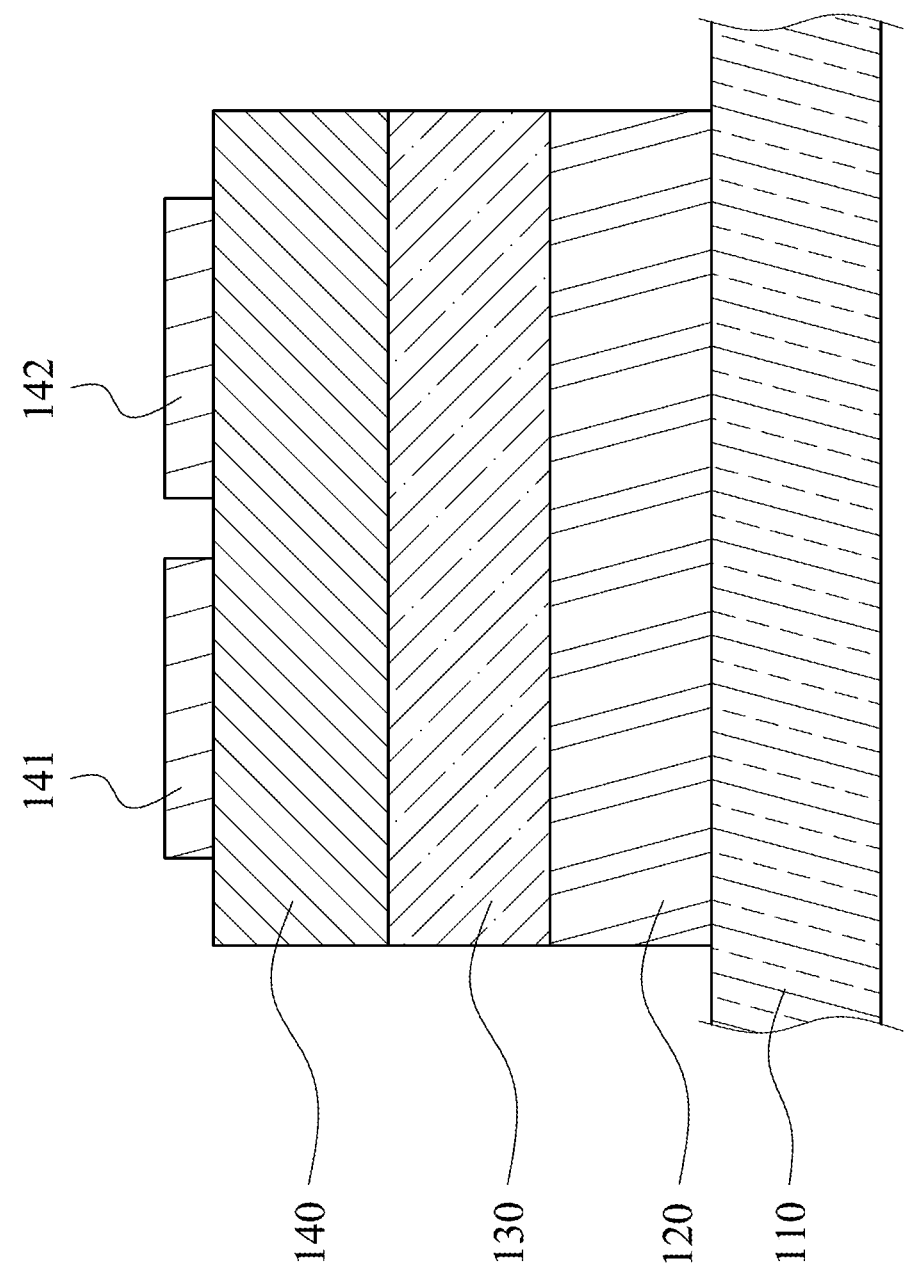
FIG. 1B is a structure schematic view of a micro semiconductor structure according to another example of the 1st embodiment of the present disclosure.

The micro semiconductor 140 is disposed on the protective layer 130, and the micro semiconductor 140 and the dissociative layer 120 are located on the same side of the substrate 110. According to the 1st embodiment, the dissociative layer 120, the protective layer 130 and the micro semiconductor 140 are located on the same side of the substrate 110, but the present disclosure is not limited thereto. In detail, the size of the micro semiconductor 140 is less than or equal to 100 micrometers. The micro semiconductor 140 can be a micro light emitting diode (Micro LED), a micro laser diode, or a micro photodiode, but the present disclosure is not limited thereto. According to other embodiments, the micro semiconductor 140 can also be the micro semiconductor 140 with controllable execution of predetermined electronic functions, such as micro diode, micro transistor, micro integrated circuit, or micro sensor, but is not limited thereto. In particular, please refer to FIG. 1B, which is a schematic view of a micro semiconductor structure 100 according to another example of the 1st embodiment of the present disclosure. In FIG. 1B, the micro semiconductor 140 can have electrodes 141, 142 electrically connected with the micro semiconductor 140, wherein the electrodes 141, 142 face upward and can have different electrical properties. Therefore, the yield rate of the electrodes 141, 142 can be prevented from being affected by the residue of the protective layer 130, but the arrangement of the electrodes is not limited thereto. Herein, the micro semiconductor structure 100 is a flip-chip type micro semiconductor structure. The micro semiconductor structure in other embodiments which is not shown can be as a vertical type micro semiconductor structure.

When a thickness of the dissociative layer 120 vertical to the substrate 110 is Dd, a thickness of the protective layer 130 vertical to the substrate 110 is Dp, and a thickness of the micro semiconductor 140 vertical to the substrate 110 is Dc, the following condition can be satisfied: 0.1<Dp/Dd. Therefore, it is favorable for avoiding insufficient protection due to too small size of the protective layer 130. Further, the following condition can be satisfied: Dp/Dc<1. Therefore, it is favorable for avoiding the difficulties to remove the protective layer 130 in the following processes due to the excessive size thereof. Furthermore, Dd can be ranged between 500 nm to 6000 nm, Dp can be ranged between 50 nm to 500 nm, and Dc can be ranged between 4 micrometers to 10 micrometers. Therefore, it is favorable for further preventing the micro semiconductor 140 becoming abnormal or to be damaged from the light source L during the LLO process by the protective layer 130.

A absorbance of the dissociative layer 120 to the light source L can be greater than a absorbance of the protective layer 130 to the light source L, and a material ablation rate of the dissociative layer 120 to the light source L can be greater than a material ablation rate of the protective layer 130 to the light source L. During the LLO process, the dissociative layer 120 can be removed before protective layer 130, and the light which does not be absorbed can be blocked by the protective layer 130 due to a low transmittance of the protective layer 130. Therefore, the protective layer 130 can provide a better protection to the micro semiconductor 140 and prevent the micro semiconductor 140 from the irradiation of the light source L to become abnormal or be damaged.

Figure 2:
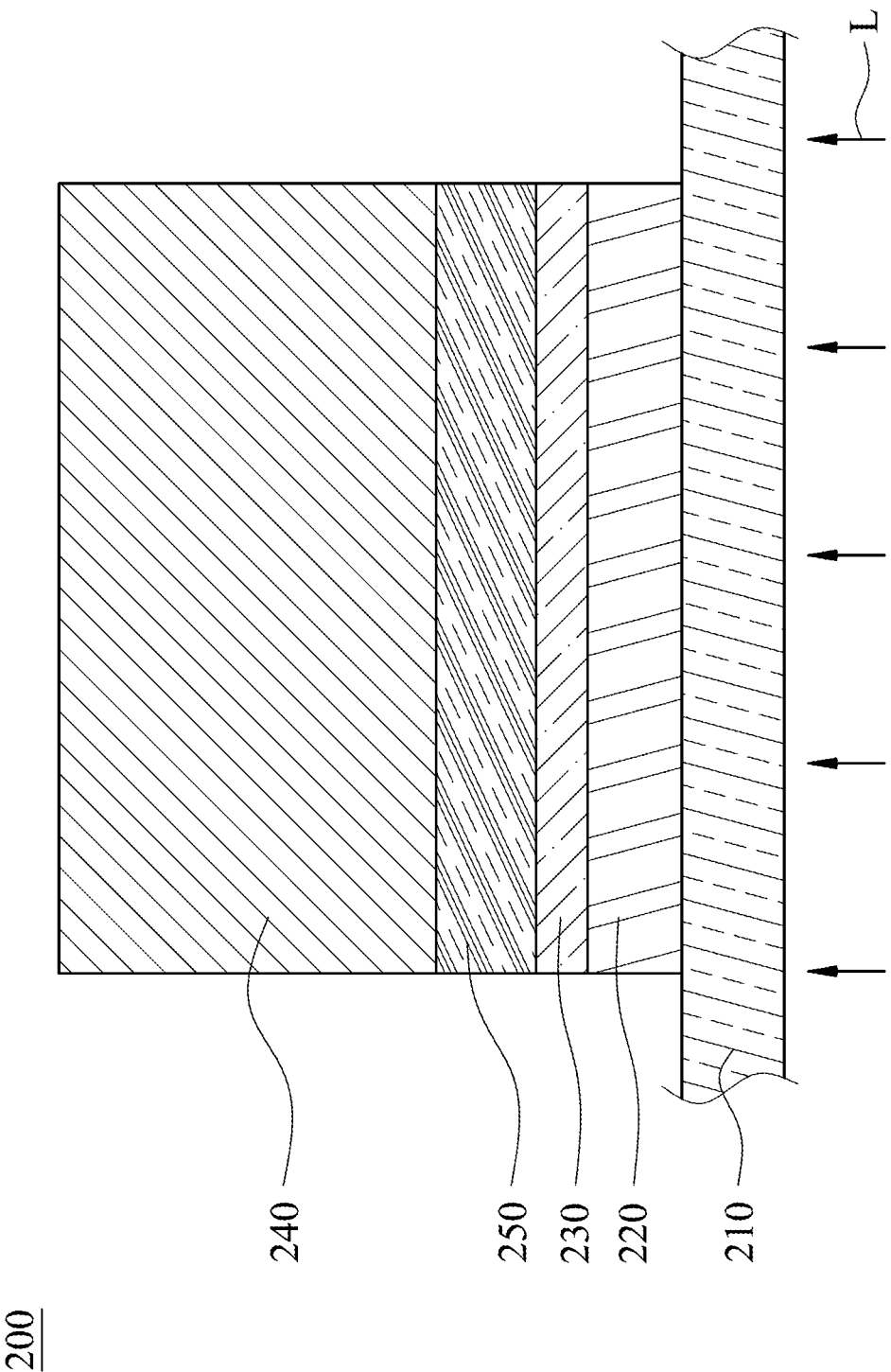
FIG. 2 is a structure schematic view of a micro semiconductor structure according to the 2nd embodiment of the present disclosure.

FIG. 2 is a schematic view of a micro semiconductor structure 200 according to the 2nd embodiment of the present disclosure. As shown in FIG. 2, the micro semiconductor includes a substrate 210, a dissociative layer 220, a protective layer 230, a micro semiconductor 240, and a removable layer 250. The dissociative layer 220, the protective layer 230, the removable layer 250, and the micro semiconductor 240 are disposed on the substrate 210 in order.

In detail, according to the 2nd embodiment, the dissociative layer 220 is located on one side of the substrate 210 and is disposed on the substrate 210. The protective layer 230 is disposed on the dissociative layer 220, and the protective layer 230 and the dissociative layer 220 are located on the same side of the substrate 210. The micro semiconductor 240 is located on the same side with the protective layer 230 and the dissociative layer 220, and the micro semiconductor 240 and the dissociative layer 220 are located on the same side of the substrate 210. The material and the size of the dissociative layer 220, the protective layer 230 and the micro semiconductor 240 can be the same with or similar to the corresponding elements in the 1st embodiment, and will not be described again hereafter.

The removable layer 250 is disposed between the protective layer 230 and the micro semiconductor 240, and the removable layer 250 and the dissociative layer 220 are located on the same side of the substrate 210. Due to the necessity of the removal of the protective layer 230 in the following processes, it is favorable for separating the protective layer 230 from the micro semiconductor 240 by disposing the removable layer 250. In detail, the protective layer 230 can be removed by etching the removable layer 250 with an etching solution, and an etching rate of the etching solution to the removable layer 250 is greater than an etching rate of the etching solution to the protective layer 230, but is not limited thereto. Therefore, it is more favorable for removing the protective layer 230 in the following processes. The removable layer 250 can be made of an organic material, including organic polymer materials, such as polyimide, benzocyclobutene, phenol formaldehyde resin, epoxy resin, polyisoprene rubber or combinations thereof. Furthermore, the material of the removable layer 250 and the material of the dissociative layer 220 can be the same, which can decrease the complexity of the manufacturing process, but the present disclosure is not limited thereto.

Figure 3:
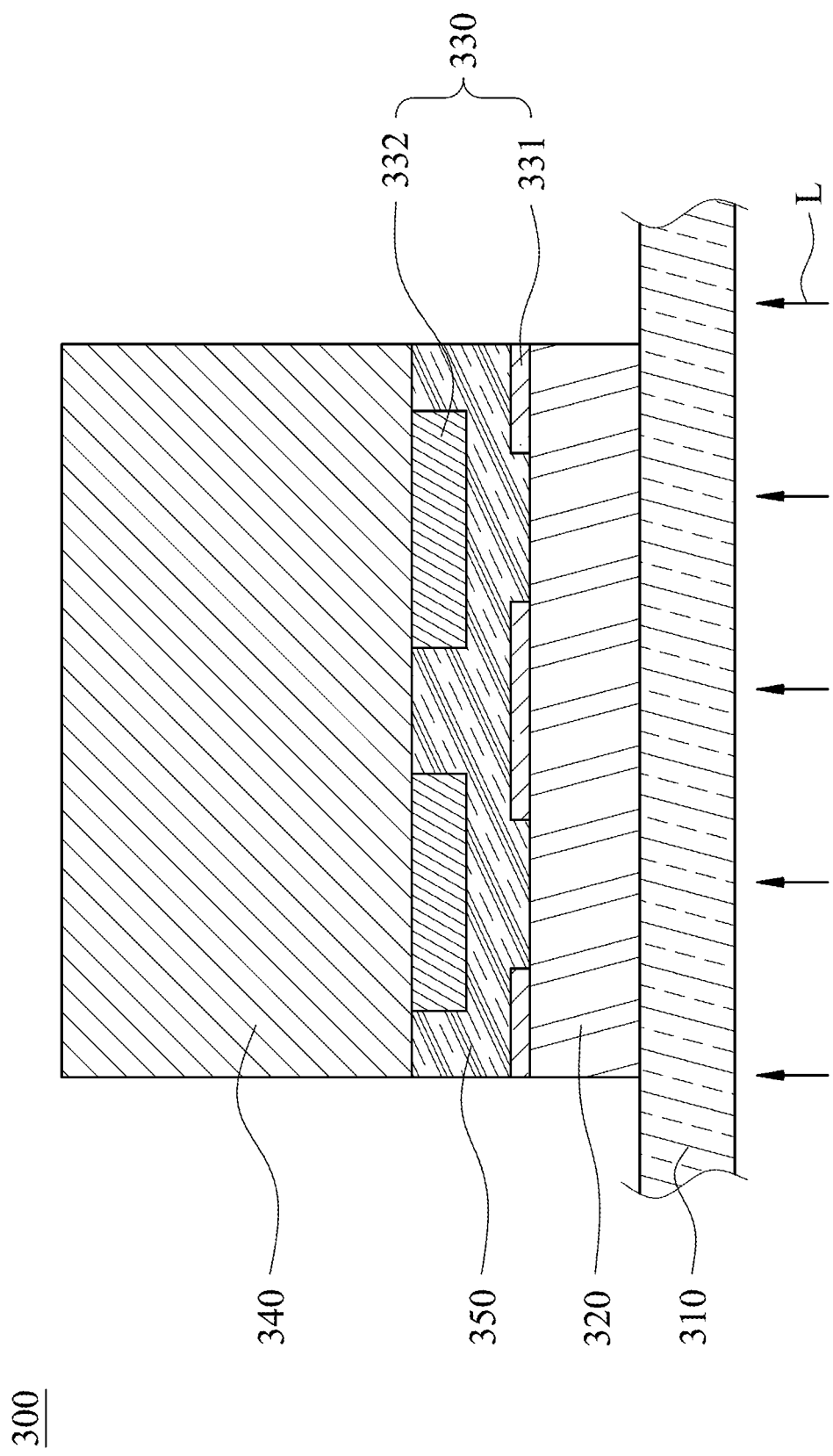
FIG. 3 is a structure schematic view of a micro semiconductor structure according to the 3rd embodiment of the present disclosure.

FIG. 3 is a schematic view of a micro semiconductor structure 300 according to the 3rd embodiment of the present disclosure. As shown in FIG. 3, the micro semiconductor structure 300 includes a substrate 310, a dissociative layer 320, a protective layer 330, a micro semiconductor 340 and a removable layer 350. The dissociative layer 320, the protective layer 330, the removable layer 350 and the micro semiconductor 340 are located on the same side of the substrate 310.

In detail, according to the 3rd embodiment, the dissociative layer 320 is located and disposed on one side of the substrate 310. The protective layer 330 is a patterned structure and includes a first protective layer 331 disposed on the dissociative layer 320, and the first protective layer 331 and the dissociative layer 320 are located on the same side of the substrate 310. The first protective layer 331 is also a patterned structure, wherein the patterned structure can be a discontinuous layer structure, but is not limited thereto. The removable layer 350 is disposed between the first protective layer 331 and the micro semiconductor 340. The micro semiconductor 340 is disposed on the removable layer 350, and the micro semiconductor 340 and the dissociative layer 320 are located on the same side of the substrate 310.

In detail, the first protective layer 331 has a total area Apt, wherein the total area Apt represents a sum of the areas of the first protective layer 331 vertically projecting to the substrate 310. The dissociative layer 320 has an area Ad, wherein the area Ad represents the area of the dissociative layer 320 vertically projecting to the substrate 310. A ratio of the total area of the first protective layer 331 to the area of the dissociative layer 320 is Apt/Ad, which can be greater than 0.5 and less than 1. When the ratio Apt/Ad is less than or equal to 0.5, it represents the protection to a micro semiconductor being insufficient. Moreover, the ratio Apt/Ad can be greater than 0.5 and less than or equal to 0.8. Therefore, the micro semiconductor 340 can be protected further effectively by the first protective layer 331 from the irradiation of light source L and to avoid the generation of abnormity or damage during the LLO process.

Furthermore, according to the 3rd embodiment, the protective layer 330 can further include a second protective layer 332, wherein the second protective layer 332 is a patterned structure. The second protective layer 332 includes metal materials, which can be metals, metal alloys or metal oxides, but the present disclosure is not limited thereto. The first protective layer 331 can be further disposed alternately with the second protective layer 332. According to the 3rd embodiment, the first protective layer 331 and the second protective layer 332 are located on the same side of the substrate 310, and a vertical projecting area of the first protective layer 331 to the substrate 310 overlaps partially with a vertical projecting area of the second protective layer 332 to the substrate 310, but the vertical projecting area of the first protective layer 331 to the substrate 310 can also not overlap with the vertical projecting area of the second protective layer 332 to the substrate 310, the present disclosure is not limited thereto. Moreover, an arbitrary position of a vertical projection of the micro semiconductor 340 to the substrate 310 overlaps with a vertical projection of the first protective layer 331 to the substrate 310 and a vertical projection of the second protective layer 332 to the substrate 310 or one of the two vertical projections thereof. The second protective layer 332 and the first protective layer 331 are disposed alternately since the second protective layer 332 which includes metal materials is not easy to be affected by the light source L, so that the micro semiconductor 340 can be protected more effectively from the damage by the influence of the light source L. In particular, the second protective layer 332 can be aligned with a surface (its reference numeral is omitted) of the micro semiconductor 340 or be disposed under the micro semiconductor 340, but the present disclosure is not limited thereto. Further, the second protective layer 332 can be used as an electrode of the micro semiconductor 340 which has effects of protection and electrical connection to the micro semiconductor 340 so as to enhance the manufacturing yield rate.

Figure 4:
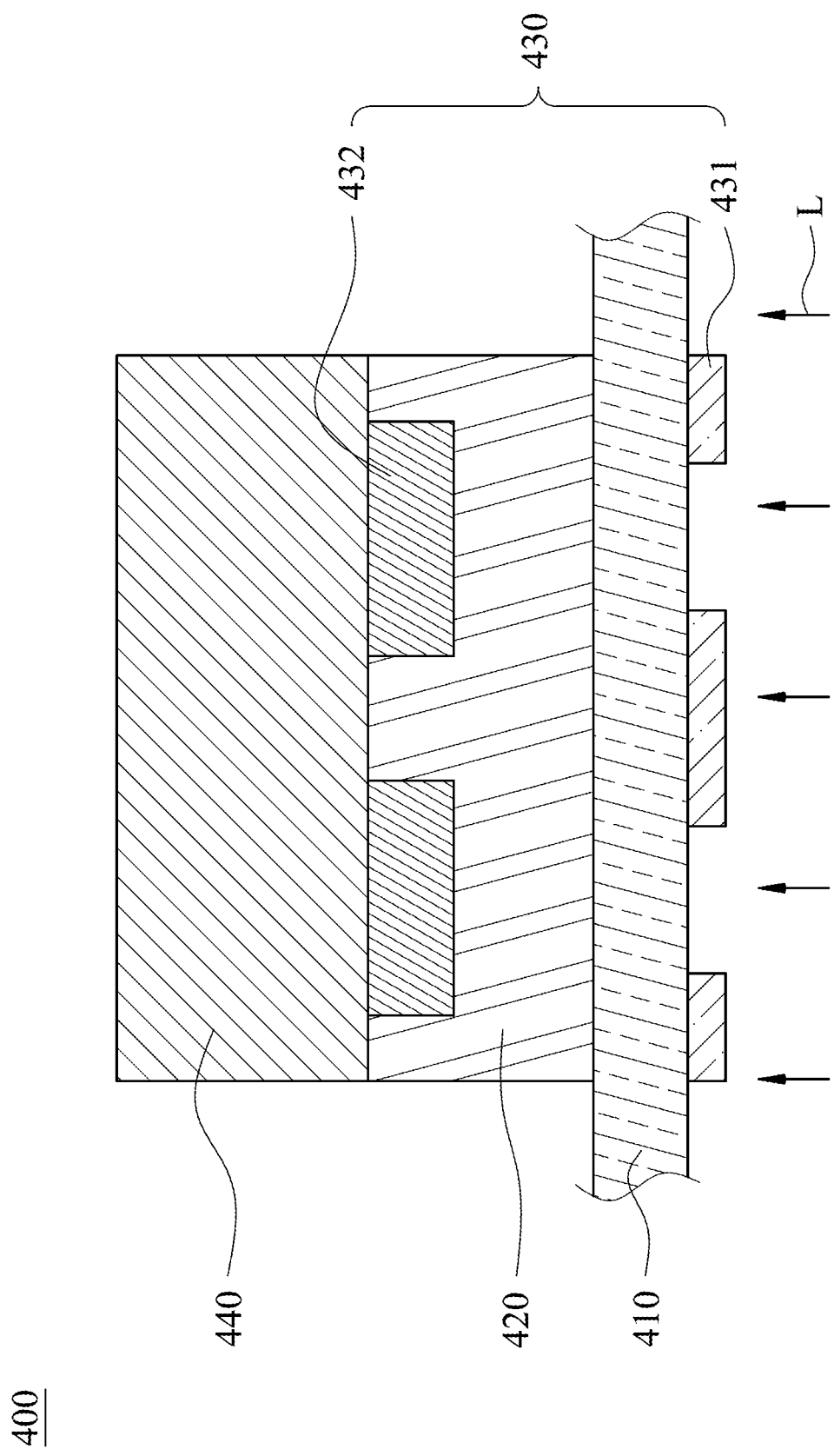
FIG. 4 is a structure schematic view of a micro semiconductor structure according to the 4th embodiment of the present disclosure.

FIG. 4 is a schematic view of a micro semiconductor structure 400 according to the 4th embodiment of the present disclosure. As shown in FIG. 4, the micro semiconductor includes a substrate 410, a dissociative layer 420, a protective layer 430, and a micro semiconductor 440, wherein the substrate 410, the dissociative layer 420, and the micro semiconductor 440 are arranged in order.

In detail, according to the 4th embodiment, the dissociative layer 420 is located and disposed on one side of the substrate 410. The protective layer 430 is a patterned structure and includes a first protective layer 431 disposed on the other side of the substrate 410; that is, the first protective layer 431 and the dissociative layer 420 are located on the different sides of the substrate 410. The micro semiconductor 440 is disposed on the dissociative layer 420, and the micro semiconductor 440 and the dissociative layer 420 are located on the same side of the substrate 410.

In detail, the first protective layer 431 has a total area Apt, wherein the total area Apt represents a sum of the areas of the first protective layer 431 vertically projecting to the substrate 410. The dissociative layer 420 has an area Ad, wherein the area Ad represents the area of the dissociative layer 420 vertically projecting to the substrate 410. A ratio of the total area of the first protective layer 431 to the area of the dissociative layer 420 is Apt/Ad, which can be greater than 0.5 and less than 1. Moreover, the ratio Apt/Ad can be greater than 0.5 and less than or equal to 0.8. Therefore, the micro semiconductor 440 can be protected further effectively by the first protective layer 431 from the irradiation of light source L and to avoid the generation of abnormity or damage during the LLO process.

According the 4th embodiment, the protective layer 430 can further include the second protective layer 432, which is a patterned structure. The second protective layer 432 includes metal materials, which can be metals, metal alloys or metal oxides. The first protective layer 431 and the second protective layer 432 can be disposed alternately. In detail, an area of the first protective layer 431 to the substrate 410 overlaps partially with a vertical projecting area of the second protective layer 432 to the substrate 410. It is worth to be mentioned that an overlapping area of the vertical projecting area of the second protective layer 432 to the substrate 410 and the vertical projecting area of the first protective layer 431 to the substrate 410 is less than 10% of an area of the second protective layer 432 towards the substrate 410. Therefore, it can be ensured that an enough amount of the dissociative layer 420 can be dissociated by the irradiation of the light source L during the LLO process so as to separate the micro semiconductor 440 from the substrate 410 successfully. Moreover, in the premise of without the need to configure the protective layer 430 with an excessive area, the result of protecting the micro semiconductor 440 effectively from the influence of the irradiation of the light source L can be achieved, and the manufacturing cost can be decreased by reducing the overuse of the protective layer 430 material. Moreover, an arbitrary position of a vertical projection of the micro semiconductor 440 to the substrate 410 overlaps with a vertical projection of the first protective layer 431 to the substrate 410 and a vertical projection of the second protective layer 432 to the substrate 410 or one of the two vertical projections thereof. The first protective layer 431 and the second protective layer 432 can be disposed on the two sides of the substrate 410 respectively. Therefore, the micro semiconductor 440 can be protected further effectively from the damage by the influence of the light source L. In particular, the second protective layer 432 can be aligned with a surface (its reference numeral is omitted) of the micro semiconductor 440 or be disposed under the micro semiconductor 440. Further, the second protective layer 432 can be used as an electrode of the micro semiconductor 440 which has the effects of protection and electrical connection to the micro semiconductor 440 so as to enhance the manufacturing yield rate.

Figure 5:
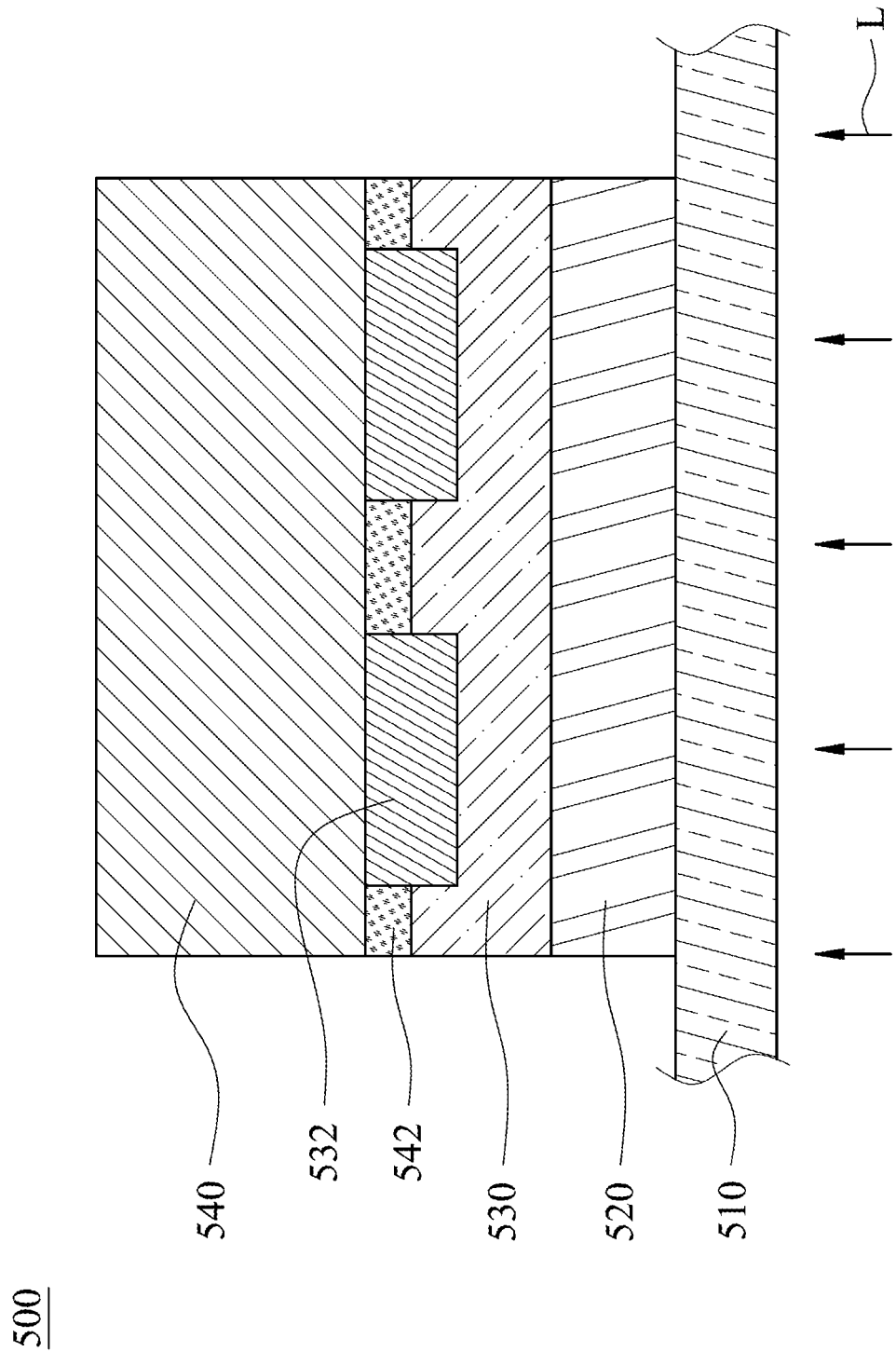
FIG. 5 is a structure schematic view of a micro semiconductor structure according to the 5th embodiment of the present disclosure.

FIG. 5 is a schematic view of a micro semiconductor structure 500 according to the 5th embodiment of the present disclosure. As shown in FIG. 5, the micro semiconductor structure 500 includes a substrate 510, a dissociative layer 520, a protective layer 530, and a micro semiconductor 540, wherein the dissociative layer 520, the protective layer 530, and the micro semiconductor 540 are disposed on the substrate 510 in order.

In detail, the dissociative layer 520 is located and disposed on one side of the substrate 510. The protective layer 530 is disposed on the dissociative layer 520, and the protective layer 530 and the dissociative layer 520 are located on the same side of the substrate 510. The micro semiconductor 540 is disposed on the protective layer 530, and the micro semiconductor 540 and the dissociative layer 520 are located on the same side of the substrate 510. The protective layer 530 is a patterned structure and includes a first protective layer 532.

According to the 5th embodiment, the micro semiconductor 540 can further include an insulating layer 542, wherein the insulating layer 542 is disposed on a surface towards the substrate 510 of the micro semiconductor 540 and is disposed between the first protective layer 532. In particular, the insulating layer 542 is located between the protective layer 530 and the micro semiconductor 540. Since the protective layer may be a discontinuous structure which makes the micro semiconductor 540 still has a possibility be influenced by the partial laser, the micro semiconductor 540 can be protected comprehensively by the insulating layer 542 from the irradiation of the light source L and to avoid the generation of abnormity or damage. Moreover, an arbitrary position of a vertical projection of the micro semiconductor 540 to the substrate 510 overlaps with a vertical projection of the insulating layer 542 to the substrate 510 or a vertical projection of the first protective layer 532 to the substrate 510. In detail, a transmittance of the insulating layer 542 for a light source with wavelength smaller than 360 nm is less than 20%, which can further prevent the micro semiconductor 540 from the damaged by the influence of the light source L in the LLO process. The first protective layer 532 can be aligned with a surface (its reference numeral is omitted) of the micro semiconductor 540 or be disposed under the micro semiconductor 540. Further, the first protective layer 532 can be used as an electrode of the micro semiconductor 540 which has the effects of protection and electrical connection to the micro semiconductor 540 so as to enhance the manufacturing yield rate.

Figure 6A:
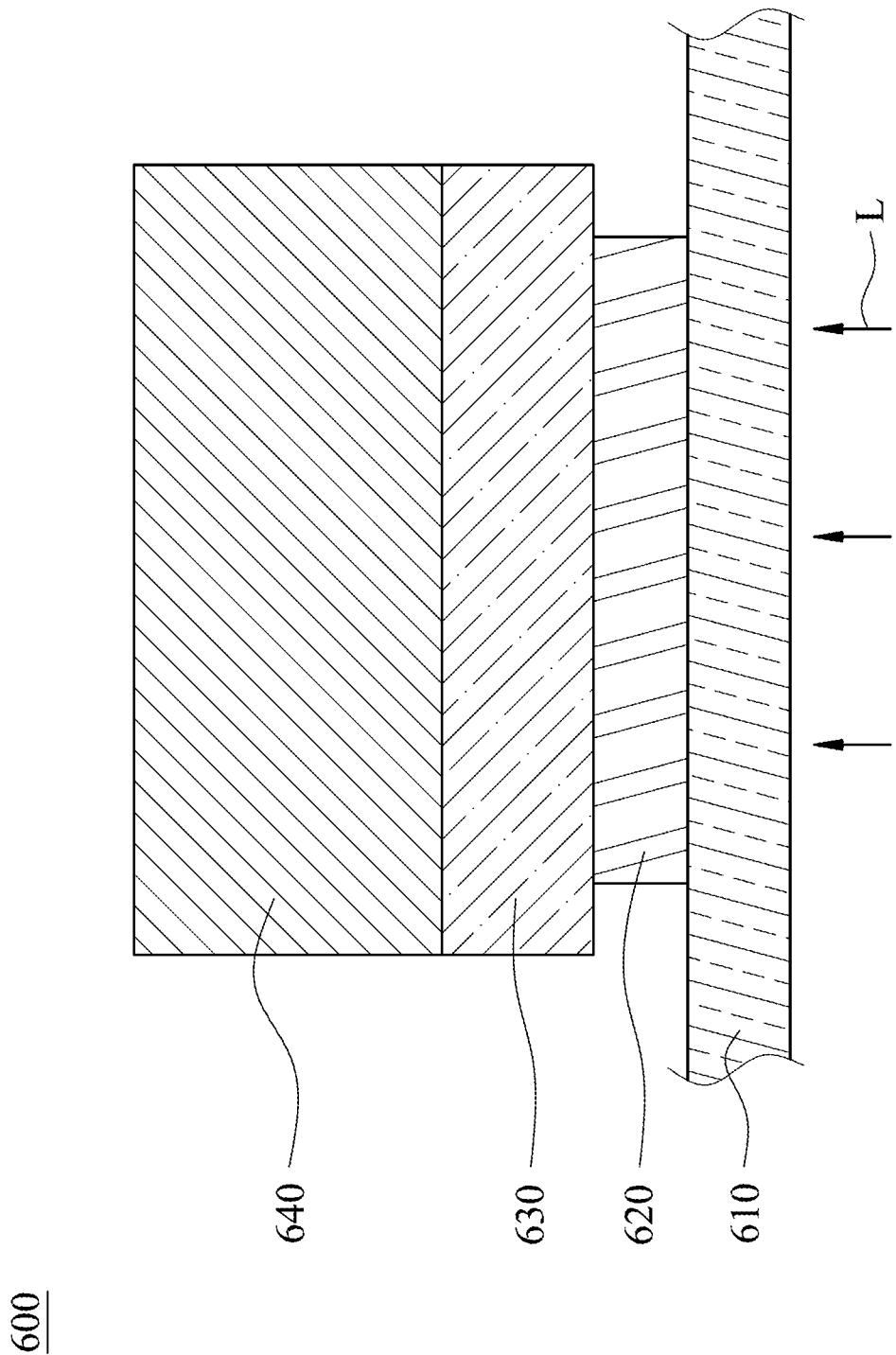
FIG. 6A is a structure schematic view of a micro semiconductor structure according to one example of the 6th embodiment of the present disclosure.

FIG. 6A is a schematic view of a micro semiconductor structure 600 according to one example of the 6th embodiment of the present disclosure. As shown in FIG. 6A, the micro semiconductor structure 600 includes a substrate 610, a dissociative layer 620, a protective layer 630, and a micro semiconductor 640, wherein the dissociative layer 620, the protective layer 630, and the micro semiconductor 640 are disposed on the substrate 610 in order.

In detail, the dissociative layer 620 is located and disposed on one side of the substrate 610. The protective layer 630 is disposed on the dissociative layer 620, and the protective layer 630 and the dissociative layer 620 are located on the same side of the substrate 610. The micro semiconductor 640 is disposed on the protective layer 630, and the micro semiconductor 640 and the dissociative layer 620 are located on the same side of the substrate 610.

As shown in FIG. 6A, the micro semiconductor 640 has a vertical projecting area Ac to the substrate 610. The protective layer 630 has a vertical projecting area Ap to the substrate 610. The dissociative layer 620 has a vertical projecting area Ad' to the substrate 610, wherein the vertical projecting area Ac of the micro semiconductor 640 to the substrate 610 and the vertical projecting area Ap of the protective layer 630 to the substrate 610 are greater than the vertical projecting area Ad' of the dissociative layer 620 to the substrate 610. Moreover, the following condition can be satisfied: $0.5<Ad'/Ac<0.8$, wherein the yield rate during the transfer of the micro semiconductor structure 600 can be affected when the ratio is too small. Therefore, in the premise without affecting the manufacturing process and the quality of the micro semiconductor structure 600, the manufacturing cost can be decreased by reducing the usage amount of the dissociative layer 620. In particular, please refer to FIG. 6B, which is a schematic view of a micro semiconductor structure 600 according to another example of the 6th embodiment of the present disclosure. In FIG. 6B, the dissociative layer 620 can be a plurality of patterned structures, such as a plurality of separated columnar structures, disposing correspondingly to an irradiation area of the laser light source which can increase the contact area so as to maintain the stability of a chip and a characteristic of miniaturization of the dissociative layer 620 during the LLO process to avoid residue of the dissociative layer 620. Further, the micro semiconductor 640 can have electrodes 641, 642 electrically connected with the micro semiconductor 640, wherein the electrodes 641, 642 face upward and can have different electrical properties. Therefore, the yield rate of the electrodes 641, 642 can be prevented from being affected by the residue of the protective layer 630, but the arrangement of the electrodes is not limited thereto.

FIG. 7 is a schematic view of a micro semiconductor structure 700 according to the 7th embodiment of the present disclosure. As shown in FIG. 7, the micro semiconductor structure 700 includes a substrate 710, a dissociative layer 720, a protective layer 730, and a micro semiconductor 740, wherein the dissociative layer 720, the protective layer 730, and the micro semiconductor 740 are disposed on the substrate 710 in order.

In detail, the protective layer 730 and the dissociative layer 720 are a patterned structure. The dissociative layer 720 is disposed under the protective layer 730 correspondingly and a vertical projecting area of the protective layer 730 to the substrate 710 is greater than a vertical projecting area of the dissociative layer 720 parallel to the substrate 710. Since the light source L only needs to irradiate the dissociative layer 720 during the LLO process, collocation with the characteristics mentioned previously, an irradiating range of the light source L can be controlled in the range of a vertical projecting area of the protective area 730 to the substrate 710 and protect the micro semiconductor 740 simultaneously in the premise of without affecting the dissociative effect of the dissociative layer 720. In particular, the protective layer 730 can be aligned with a surface (its reference numeral is omitted) of the micro semiconductor 740 or be disposed under the micro semiconductor 740. Moreover, the protective layer 730 can include metal materials, and can be used as an electrode of the micro semiconductor 740. That is, the electrode of the micro semiconductor 740 can have the characteristics of the protective layer 730. Therefore, the complexity of the micro semiconductor structure 700 can be simplified so as to reduce the manufacturing process and the cost.

FIG. 8 is a schematic view of a micro semiconductor structure 800 according to the 8th embodiment of the present disclosure. As shown in FIG. 8, the micro semiconductor structure 800 includes a substrate 810, a dissociative layer 820, a protective layer 830, and a micro semiconductor 840, wherein the substrate 810, the dissociative layer 820, the protective layer 830, and the micro semiconductor 840 are arranged in order. Moreover, the protective layer 830 can be aligned with a surface (its reference numeral is omitted) of the micro semiconductor 840 or be disposed under the micro semiconductor 840.

In detail, a cross-sectional area of the dissociative layer 820 vertical to the substrate 810 is shrunk towards the substrate 810 gradually. In other words, a width of the dissociative layer 820 parallel to the substrate 810 is shortened from the junction of the dissociative layer 820 and the micro semiconductor 840 towards the substrate 810. An irradiation center of the light source L can focus on a junction of the dissociative layer 820 and the substrate 810. Taking the laser for example, the laser has a characteristic with stronger energy in the irradiation center, which can execute the dissociation at the dissociative layer 820 on the junction of the dissociative layer 820 and the substrate 810. Therefore, a small amount of the dissociative layer 820 located at the junction of the dissociative layer 820 and the substrate 810 can only be aimed and be dissociated during the dissociation process so as to reduce the manufacturing time and the cost. However, the dissociative layer 820 is only used for an explanation for the 8th embodiment. The sort of the light source L or the specific structure of the dissociative layer 820 of the present disclosure is not limited thereto.

Figure 9:
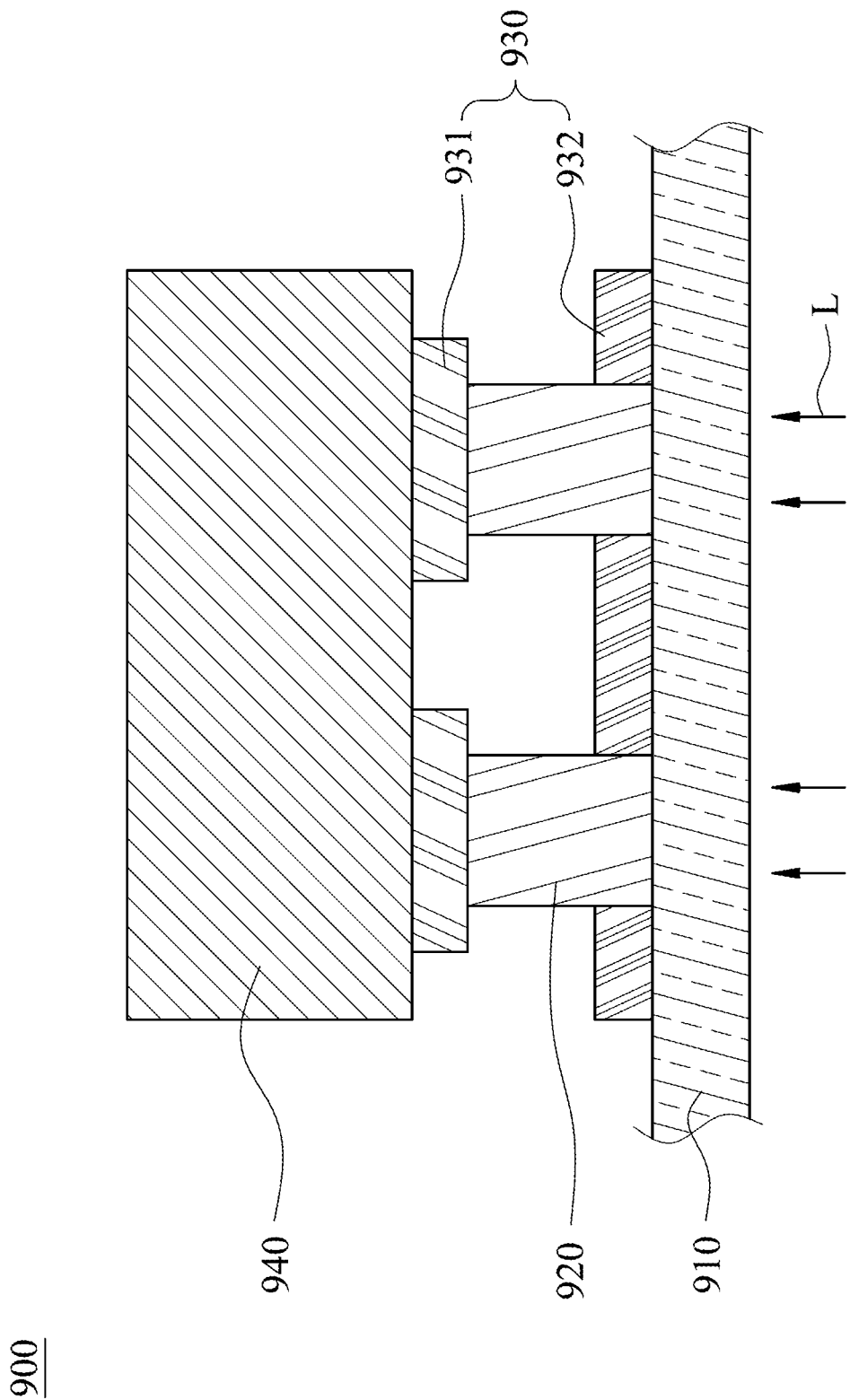
FIG. 9 is a structure schematic view of a micro semiconductor structure according to the 9th embodiment of the present disclosure.

FIG. 9 is a schematic view of a micro semiconductor structure 900 according to the 9th embodiment of the present disclosure. As shown in FIG. 9, the micro semiconductor structure 900 includes a substrate 910, a dissociative layer 920, a protective layer 930, and a micro semiconductor 940, wherein the dissociative layer 920, the protective layer 930, and the micro semiconductor 940 are located on the same side of the substrate 910.

The protective layer 930 includes a first protective layer 931 and a second protective layer 932. The first protective layer 931 and the second protective layer 932 are both patterned structures and located on the same side of the substrate 910, and the second protective layer 932 and the first protective layer 931 are disposed alternately. That is, a vertical projecting area of the first protective layer 931 to the substrate 910 overlaps partially with a vertical projecting area of the second protective layer 932 to the substrate 910. Furthermore, the dissociative layer 920 is disposed under the first protective layer 931 correspondingly, and the dissociative layer 920 is disposed between the substrate 910 and the micro semiconductor 940. Therefore, the micro semiconductor 940 can be protected further completely by the first protective layer 931 and the second protective layer 932 from the irradiation of the light source L and to avoid the generation of abnormity or damages. The first protective layer 931 can be aligned with a surface (its reference numeral is omitted) of the micro semiconductor 940 or be disposed under the micro semiconductor 940. Furthermore, the first protective layer 931 can be a plurality of electrodes of the micro semiconductor 940.

Moreover, the vertical projecting area of the first protective layer 931 to the substrate 910 is greater than a vertical projecting area of the dissociative layer 920 to the substrate 910. Therefore, during the LLO process, the micro semiconductor 940 can be protected more effectively by the first protective layer 931 from the influence of the light source L, and the light source L can be blocked more effectively from entering the micro semiconductor 940 by a collocation of the arrangement of the second protective layer 932.

Figure 10:
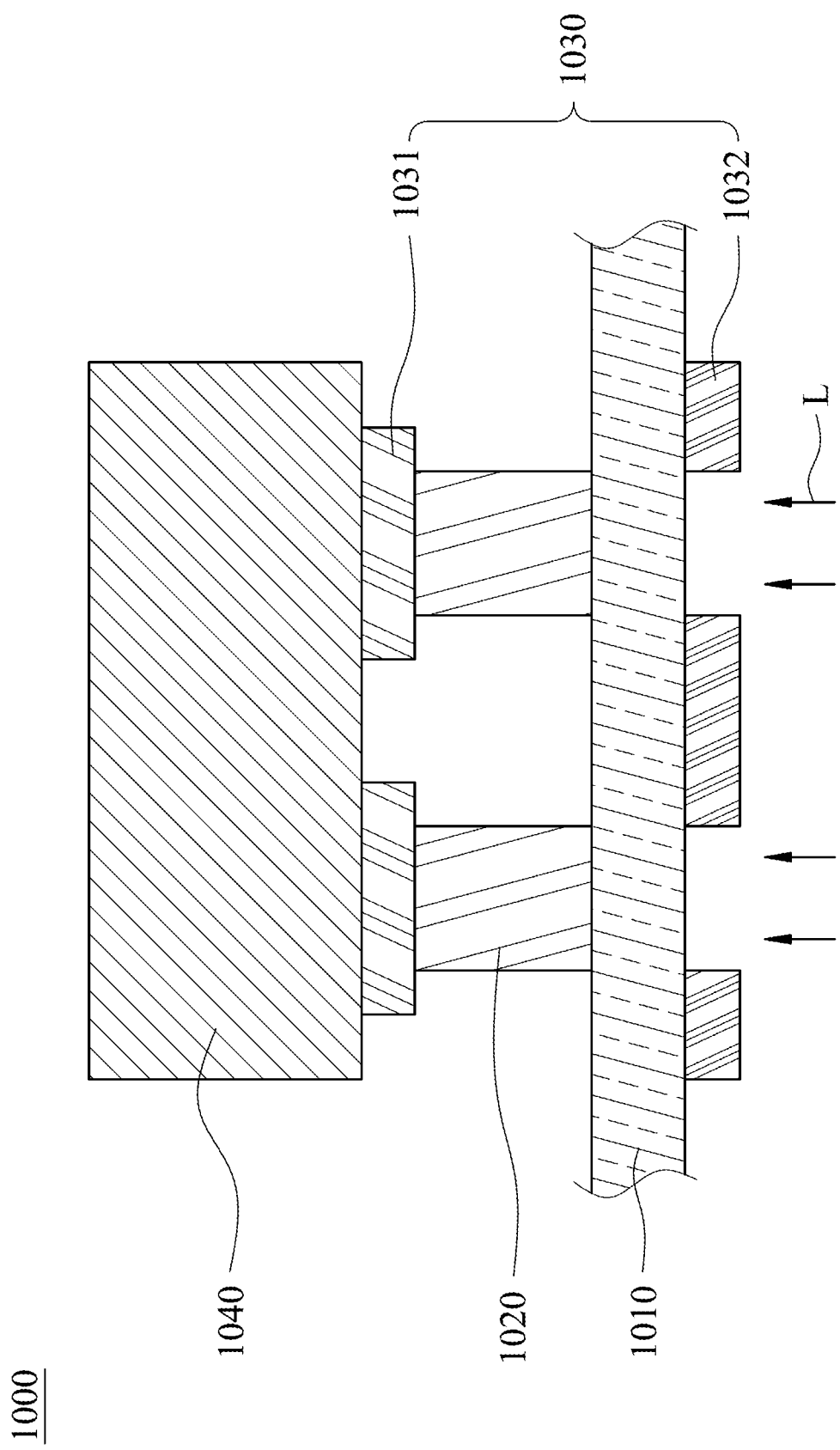
FIG. 10 is a structure schematic view of a micro semiconductor structure according to the 10th embodiment of the present disclosure.

FIG. 10 is a schematic view of a micro semiconductor structure 1000 according to the 10th embodiment of the present disclosure. As shown in FIG. 10, the micro semiconductor structure 1000 includes a substrate 1010, a dissociative layer 1020, a protective layer 1030, and a micro semiconductor 1040, wherein the dissociative layer 1020 and the micro semiconductor 1040 are located on the same side of the substrate 1010.

The protective layer 1030 includes a first protective layer 1031 which is patterned and a second protective layer 1032 which is patterned, wherein the first protective layer 1031, the dissociative layer 1020 and the micro semiconductor 1040 are located on the same side of the substrate 1010. The second protective layer 1032 is located on the other side of the substrate 1010, and the second protective layer 1032 and the first protective layer 1031 are disposed alternately. Therefore, the coverage of the protective layer 1030 can be increased and the micro semiconductor 1040 can be protected more effectively by the protective layer 1030 from the irradiation of the light source L and to avoid the generation of abnormity or damages. The first protective layer 1031 can be aligned with a surface (its reference numeral is omitted) of the micro semiconductor 1040 or be disposed under the micro semiconductor 1040. Furthermore, the first protective layer 1031 can be a plurality of electrodes of the micro semiconductor 1040.

Moreover, a vertical projecting area of the first protective layer 1031 to the substrate 1010 is greater than a vertical projecting area of the dissociative layer 1020 to the substrate 1010. Therefore, the micro semiconductor 1040 can be protected more effectively by the first protective layer 1031 from the influence of the light source L, and the light source L can be blocked more effectively from entering the micro semiconductor 1040 by a collocation of the arrangement of the second protective layer 1032.

Figure 11:
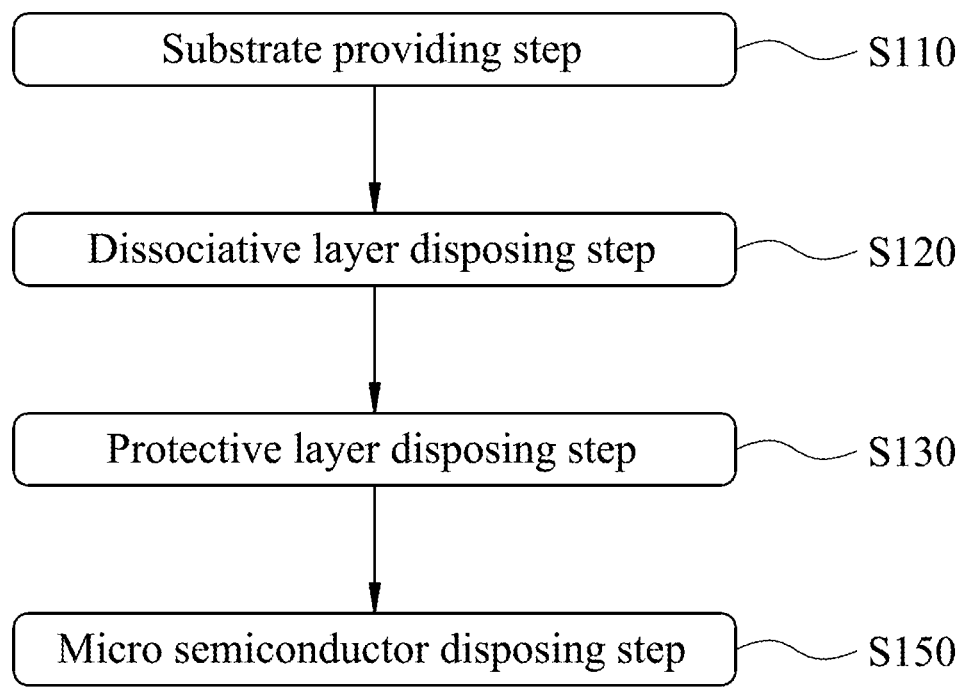
FIG. 11 is a processing flow diagram of a manufacturing method of a micro semiconductor structure according to the 11th embodiment of the present disclosure.

FIG. 11 is a processing flow diagram of a manufacturing method of a micro semiconductor structure S100 according to the 11th embodiment of the present disclosure. As shown in FIG. 11, the manufacturing method of the micro semiconductor structure S100 includes a substrate providing step S110, a dissociative layer disposing step S120, a protective layer disposing step S130, and a micro semiconductor S150. In order to explain more clearly and completely, the 11th embodiment will be described by collocating with the structures, components, and symbols with the micro semiconductor structure 700 of the 7th embodiment in FIG. 7, but the micro semiconductor structure manufactured by the 7th embodiment is not limited thereto. In the substrate providing step S110, the substrate 710 is provided. In the dissociative layer disposing step S120, the dissociative layer 720 is disposed on one side of the substrate 710. In the protective layer disposing step S130, the protective layer 730 is disposed on at least one side of the substrate 710. In the micro semiconductor disposing step S150, the micro semiconductor 740 is disposed on the same side with the dissociative layer 720 of the substrate 710, wherein the transmittance of the protective layer 730 for a light source with wavelength smaller than 360 nm is less than 20%. Therefore, the micro semiconductor structure 700 provided by the manufacturing method of the micro semiconductor structure S100 includes the protective layer 730 which can protect the micro semiconductor 740 from the irradiation of the light source L to become abnormal or to be damaged.

In particular, the materials, the characteristics of the materials and the sizes of the components provided in each step can be any one of the previous embodiments and can be adjusted on demand of the manufacturing process, and will not be described again hereafter.

Furthermore, in FIG. 7 and FIG. 11, the arrangement of the protective layer 730 corresponds to the dissociative layer 720, and the vertical projecting area of the protective layer 730 to the substrate 710 is greater than a vertical projecting area of the dissociative layer 720 to the substrate 710. When the dissociative layer 720 is dissociated by the light source L, the light source L and the protective layer 730 can be disposed on the two sides of the dissociative layer 720 correspondingly, wherein the wavelength of the laser light source is between 240 nm and 360 nm. Therefore, in the premise of without affecting the dissociating effect of the dissociative layer 720, the micro semiconductor 740 can be protected effectively.

Figure 12:
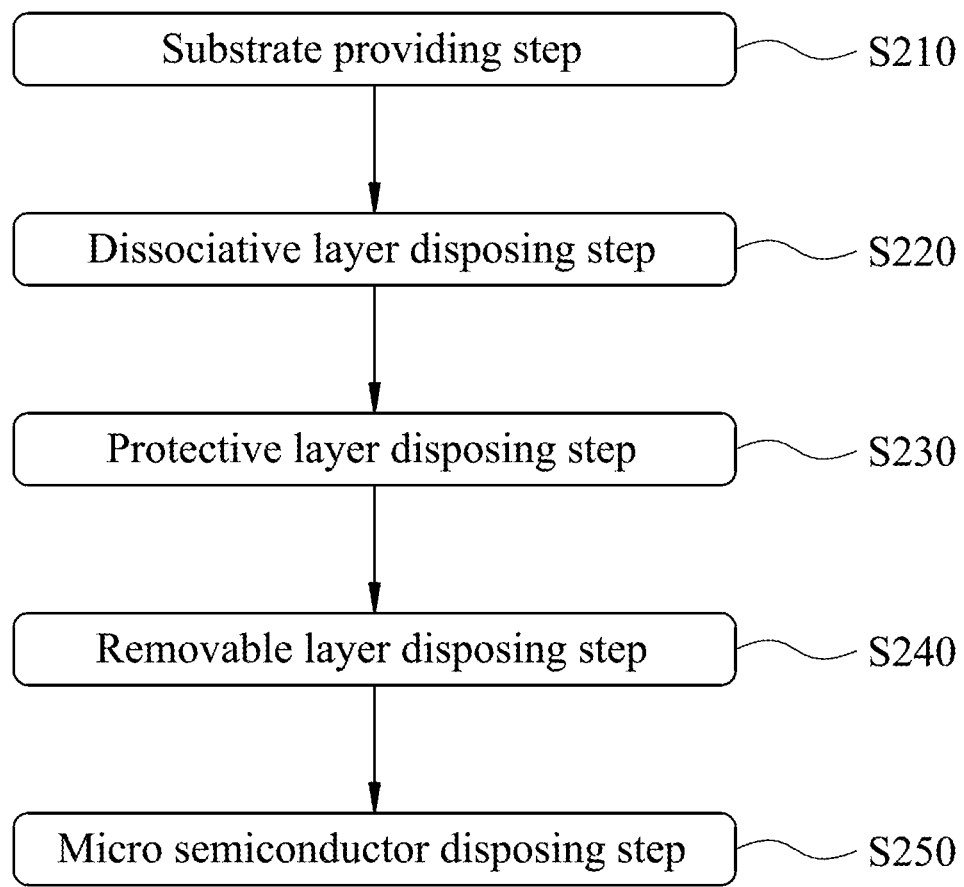
FIG. 12 is a processing flow diagram of a manufacturing method of a micro semiconductor structure according to the 12th embodiment of the present disclosure.

FIG. 12 is a processing flow diagram of a manufacturing method of a micro semiconductor structure S200 according to the 12th embodiment of the present disclosure. As shown in FIG. 12, the manufacturing method of the micro semiconductor structure S200 includes a substrate providing step S210, a dissociative layer disposing step S220, a protective layer disposing step S230, a removable layer disposing step S240, and a micro semiconductor disposing step S250. In order to explain more clearly and completely, the 12th embodiment will be described by collocating with the structures, components, and symbols with the micro semiconductor structure 200 of the 2nd embodiment in FIG. 2, but the micro semiconductor structure manufactured by the 12th embodiment is not limited thereto. In the substrate providing step S210, the substrate 210 is provided. In the dissociative layer disposing step S220, the dissociative layer 220 is disposed on one side of the substrate 210. In the protective layer disposing step S230, the protective layer 230 is disposed and located on at least one side of the substrate 210. In the removable layer disposing step S240, the removable layer 250 is disposed on the protective layer 230. In the micro semiconductor disposing step S250, the micro semiconductor 240 is disposed and located on the same side with the dissociative layer 220 of the substrate 210, wherein the removable layer 250 is located between the micro semiconductor 240 and the protective layer 230. Therefore, the protective layer 230 can be removed more easily in the following processes. In particular, a patterned structure on the protective layer 230 can be formed by a photolithography etching process, and can further include a plurality of protective layers, which is similar to the first protective layer 331 and the second protective layer 332 of the micro semiconductor structure 300 according to the 3rd embodiment in FIG. 3, and can be adjusted on demand of the manufacturing process, and will not be described again hereafter.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A micro semiconductor structure, comprising:
   a substrate;
   a dissociative layer located on one side of the substrate;
   a protective layer located on at least one side of the substrate;
   a micro semiconductor located on one side of the dissociative layer away from the substrate; and
   a removable layer disposed between the protective layer and the micro semiconductor;
   wherein a transmittance of the protective layer for a light source with wavelength smaller than 360 nm is less than 20%,
   wherein all of the dissociative layer, the protective layer and the micro semiconductor are located on the one side of the substrate, and the dissociative layer is disposed on the substrate, the protective layer is disposed on the dissociative layer, the micro semiconductor is disposed on the protective layer.

2. The micro semiconductor structure of claim 1, wherein a Young's modulus of the protective layer is greater than a Young's modulus of the dissociative layer.

3. The micro semiconductor structure of claim 1, wherein the removable layer and the dissociative layer are made of organic materials, and the protective layer is made of an inorganic material.

4. The micro semiconductor structure of claim 1, wherein the protective layer is a patterned structure.

5. The micro semiconductor structure of claim 4, wherein a ratio of a total area of the protective layer vertically projecting to the substrate to an area of the dissociative layer vertically projecting to the substrate is between 0.5 and 1.

6. The micro semiconductor structure of claim 4, wherein the dissociative layer is disposed under the protective layer correspondingly, and a vertical projecting area of the protective layer to the substrate is greater than or equal to a vertical projecting area of the dissociative layer to the substrate.

7. The micro semiconductor structure of claim 6, wherein the protective layer comprises a metal material.

8. The micro semiconductor structure of claim 1, wherein the protective layer comprises:
   a first protective layer; and
   a second protective layer, wherein the second protective layer and the first protective layer are disposed alternately.

9. The micro semiconductor structure of claim 8, wherein an arbitrary position of a vertical projection of the micro semiconductor to the substrate overlaps with a vertical projection of the first protective layer to the substrate or a vertical projection of the second protective layer to the substrate.

10. The micro semiconductor structure of claim 1, wherein a cross-sectional area of the dissociative layer vertical to the substrate is shrunk towards the substrate gradually.

11. The micro semiconductor structure of claim 1, wherein the micro semiconductor comprises:
an insulating layer located between the micro semiconductor and the protective layer.

12. The micro semiconductor structure of claim 1, wherein a vertical projecting area of the micro semiconductor or a vertical projecting area of the protective layer to the substrate is greater than a vertical projecting area of the dissociative layer to the substrate.

* * * * *